United States Patent
Chung et al.

(10) Patent No.: US 9,728,250 B2
(45) Date of Patent: Aug. 8, 2017

(54) MEMORY WRITE TRACKING DEVICE AND METHOD

(71) Applicant: M31 Technology Corporation, Hsinchu County (TW)

(72) Inventors: Chao-Kuei Chung, Taichung (TW); Nan-Chun Lien, Taipei (TW)

(73) Assignee: M31 Technology Corporation, Hsinchu County (TW)

(*) Notice: Subject to any disclaimer, the term of this patent is extended or adjusted under 35 U.S.C. 154(b) by 0 days.

(21) Appl. No.: 15/295,656

(22) Filed: Oct. 17, 2016

(65) Prior Publication Data

US 2017/0110183 A1    Apr. 20, 2017

(30) Foreign Application Priority Data

Oct. 19, 2015 (TW) .............................. 104134239 A

(51) Int. Cl.
 G11C 11/419 (2006.01)
 G06F 3/06 (2006.01)

(52) U.S. Cl.
 CPC .......... *G11C 11/419* (2013.01); *G06F 3/0619* (2013.01); *G06F 3/0653* (2013.01); *G06F 3/0673* (2013.01)

(58) Field of Classification Search
 USPC ........................................................ 365/154
 See application file for complete search history.

(56) References Cited

U.S. PATENT DOCUMENTS

| 7,142,445 B2 | 11/2006 | Hamada et al. |
| 8,451,672 B2 | 5/2013 | Tachibana |
| 8,811,070 B1* | 8/2014 | Rai .................. G11C 11/419 365/154 |
| 2013/0100730 A1* | 4/2013 | Chang ................ G11C 8/08 365/154 |

(Continued)

OTHER PUBLICATIONS

Wei-Nan Liao et al., A 40nm 1.0Mb 6T Pipeline SRAM with Digital-Based Bit-Line Under-Drive, Three-Step-Up Word-Line, Adaptive Data-Aware Write-Assist with VCS Tracking and Adaptive Voltage Detector for Boosting Control, SOC Conference (SOCC), 2013 IEEE 26th International, pp. 110-115.

(Continued)

*Primary Examiner* — Hoai V Ho
*Assistant Examiner* — Minh Dinh
(74) *Attorney, Agent, or Firm* — Winston Hsu

(57) ABSTRACT

A memory write tracking device is applied to a data write operation to at least a memory cell row. The memory write tracking device includes a dummy cell row, a variation sensor, a judging device and a word-line pulse generator. The dummy cell row includes a plurality of dummy memory cells for simulating the data write operation to the memory cell row. The variation sensor senses a set of circuit parameters for write ability of the memory cell row. The judging device determines a threshold number according to a change of the set of circuit parameters and sends an enabling signal when a threshold number of the dummy memory cells have been successfully written with the data. The word-line pulse generator determines a write cycle of the data write operation in response to the enabling signal. An associated memory write tracking method is also provided.

10 Claims, 9 Drawing Sheets

(56) References Cited

U.S. PATENT DOCUMENTS

2013/0322193 A1* 12/2013 Sahu ..................... G11C 7/227
365/194

OTHER PUBLICATIONS

Keiichi Kushida et al., A 27% Active and 85% Standby Power Reduction in Dual-Power-Supply SRAM Using BL Power and Digitally Controllable Retention Circuit, Solid-State Circuits Conference (A-SSCC), 2013 IEEE Asian, pp. 25-28.

* cited by examiner

MEMORY WRITE TRACKING DEVICE AND METHOD

FIELD OF THE INVENTION

The present disclosure relates to a memory write tracking device and a memory write tracking method, and particularly to a memory write tracking device and a memory write tracking method applied to a data write operation to a memory cell row.

BACKGROUND OF THE INVENTION

Please refer to FIG. 1, a block diagram illustrating a conventional single port static random access memory (SRAM) cell. The 6T SRAM (6 transistor static random access memory) cell includes four transistors PU1, PU2, PD1 and PD2 to constitute a latch circuit 10 and the other two transistors PG1 and PG2 to serve as a switch circuit 11. The latch circuit 10 includes two inverter circuits 101 and 102, each of which consists of two transistors. A peripheral read/write circuit (not shown) applied in the SRAM cell performs read/write operations to the SRAM cell and other SRAM cells (not shown) in the same row through the same word line WL.

Please refer to FIG. 2A, a voltage waveform chart for a successful write operation to the SRAM cell of FIG. 1. The voltage level at the left node $V_L$ is logic high "1" and the voltage level at the right node $V_R$ is logic low "0" prior to a write cycle $T_{WL}$. During the write cycle $T_{WL}$, the peripheral read/write circuit pulls the voltage $V_{BL}$ of the left bit line BL down to the ground voltage GND and pulls the voltage $V_{BLB}$ of the right bit line BLB up to the power voltage VDD. The bit lines BL and BLB are complementary bit lines. Meanwhile, the transistors PG1 and PG2 of the switch circuit 11 are switched on in response to a high logic state of a control signal on the word line WL. Therefore, the left node $V_L$ is discharged from the logic high level to a lower voltage until $V_L$ is low enough to change the output voltage $V_R$ of the right inverter circuit 102 consisting of the transistors PU2 and PD2 from logic low "0" to logic high "1". On the other hand, the right node $V_R$ is charged from the logic low level to a higher voltage until $V_R$ is high enough to change the output voltage $V_L$ of the left inverter circuit 101 consisting of the transistors PU1 and PD1 from logic high "1" to logic low "0".

Please refer to FIG. 2B, a voltage waveform chart of a write operation failure to the SRAM cell of FIG. 1. As described above, the voltage level at the left node $V_L$ is logic high "1" and the voltage level at the right node $V_R$ is logic low "0" prior to a write cycle $T_{WL}$. During the write cycle $T_{WL}$, the peripheral read/write circuit pulls the voltage $V_{BL}$ of the left bit line BL down to the ground voltage GND and pulls the voltage $V_{BLB}$ of the right bit line BLB up to the power voltage VDD. The bit lines BL and BLB carry complementary signals. Meanwhile, the transistor PG1 and PG2 of the switch circuit 11 are switched on in response to the high logic state of the control signal on the word line WL. Therefore, the left node $V_L$ is discharged from the logic high level and the right node $V_R$ is charged from the logic low level. However, for some reasons, the discharge and charge rates decrease. It is shown that till the end of the write cycle $T_{WL}$, the left node $V_L$ can not reach the low voltage threshold required to successfully change the output voltage of the right inverter circuit 102 from logic low "0" to logic high "1". Similarly, the right node $Y_R$ can not reach the high voltage threshold required to successfully change the output voltage of the left inverter circuit 101 from logic high "1" to logic low "0". Thus, the write operation to the SRAM cell fails. To ensure successful data write operation to the SRAM cell, one method is applied to prolong the write cycle $T_{WL}$. Unfortunately, a longer duration of the write cycle $T_{WL}$ results in increased power consumption, and thus it is disadvantageous to applications of portable electronic devices.

Several methods have been proposed to solve the aforementioned problem, e.g. "A 40 nm 1.0 Mb 6T Pipeline SRAM with Digital-Based Bit-Line Under-Drive, Three-Step-Up Word-Line, Adaptive Data-Aware Write-Assist with VCS Tracking and Adaptive Voltage Detector for Boosting Control", Wei-Nan Liao et al., 2013 IEEE 26th International SOC Conference (SOCC 2013), pp. 110-115, "A 27% Active and 85% Standby Power Reduction in Dual-Power-Supply SRAM Using BL Power Calculator and Digitally Controllable Retention Circuit", Keiichi Kushida et al., 2013 IEEE Asian Solid-State Circuits Conference (A-SSCC), pp. 25-28 and the related U.S. Pat. No. 8451672. However, there are still other drawbacks. Liao's disclosure only tracks the voltage pull-down in the memory cell, but does not ensure whether the data write operation to the memory cell is successful or not. Thus, the problem about write operation failure is not entirely overcome. Kushida's disclosure cannot adaptively adjust the supply voltage to the memory cell for purpose of reduction of overall power consumption. Nevertheless, the adaptive adjustment is not applicable to various memory cells with process variation.

Therefore, it is desired to provide a memory write tracking device and a memory write tracking method capable of adaptively determining an optimum write cycle $T_{WL}$ for various memory cells so as to effectively ensure successful write operation to the memory cells.

SUMMARY OF THE INVENTION

The present disclosure provides a memory write tracking device applied to a data write operation to at least a memory cell row (i.e. physical memory cells). The memory write tracking device includes: a dummy cell row for simulating at least one physical memory cell row, including a plurality of dummy memory cells wherein data are written into the dummy memory cells in response to a first control signal on a dummy word line; a variation sensor for sensing a set of circuit parameters for write ability of the memory cell row; a judging device electrically connected to the dummy memory cells and the variation sensor, for determining a threshold number according to a change of the set of circuit parameters, and sending an enabling signal when a threshold number of the dummy memory cells have been successfully written with the data; and a word-line pulse generator electrically connected to the judging device, the memory cell row and the dummy word line, for generating the first control signal to the dummy word line, generating a second control signal to control the data write operation to the memory cell row, and determining a write cycle of the second control signal in response to the enabling signal.

Another aspect of the present disclosure provides a memory write tracking device applied to a data write operation to at least a memory cell row. The memory write tracking device includes: a dummy cell row for simulating at least one physical memory cell row, including a plurality of dummy memory cells wherein data are written into the dummy memory cells in response to a control signal on a dummy word line; a judging device electrically connected to the dummy memory cells for sending an adjusting signal when a threshold number of the dummy memory cells have been successfully written with the data; and a write circuit electrically connected to the memory cell row and the judging device, for adjusting a write ability-related parameter until the adjusting device sends the adjusting signal. The write circuit includes a write assist circuit for adjusting a negative bit-line voltage or a word-line boost voltage in connection with write ability.

Another aspect of the present disclosure provides a memory write tracking device applied to a data write operation to at least a memory cell row. The memory write tracking device includes: a dummy cell row for simulating at least one physical memory cell row, including a plurality of dummy memory cells corresponding to different write abilities wherein data are written into the dummy memory cells in response to a control signal on a dummy word line; and a judging device electrically connected to the dummy memory cells, for counting the number of the dummy memory cells which have been successfully written with the data within a predetermined write cycle and adjusting write ability to the memory cell row according to the counted number.

Another aspect of the present disclosure provides a memory write tracking method applied to a data write operation to at least a memory cell row. The memory write tracking method includes steps of: providing a dummy cell row comprising a plurality of dummy memory cells; writing data into the dummy memory cells in response to a control signal; sending an enabling signal when a threshold number of the dummy memory cells have been successfully written with the data; and adjusting the control signal for writing data into the memory cell row in response to generation of the enabling signal or adjusting a write ability-related parameter if the enabling signal is not generated.

Another aspect of the present disclosure provides a memory write tracking method applied to a data write operation to at least a memory cell row. The memory write tracking method includes steps of: providing a dummy cell row comprising a plurality of dummy memory cells with different write abilities; writing data into the dummy memory cells in response to a control signal; counting the number of the dummy memory cells which have been successfully written with the data within a predetermined write cycle; and adjusting write ability to the memory cell row according to the counted number. The dummy memory cells have metal-oxide-semiconductor transistors with different sizes or doping concentrations so that each of the dummy memory cells corresponds to different write ability.

BRIEF DESCRIPTION OF THE DRAWINGS

The advantages of the present disclosure will become more readily apparent to those ordinarily skilled in the art after reviewing the following detailed description and accompanying drawings, in which.

DETAILED DESCRIPTION OF PREFERRED EMBODIMENTS

The present disclosure will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
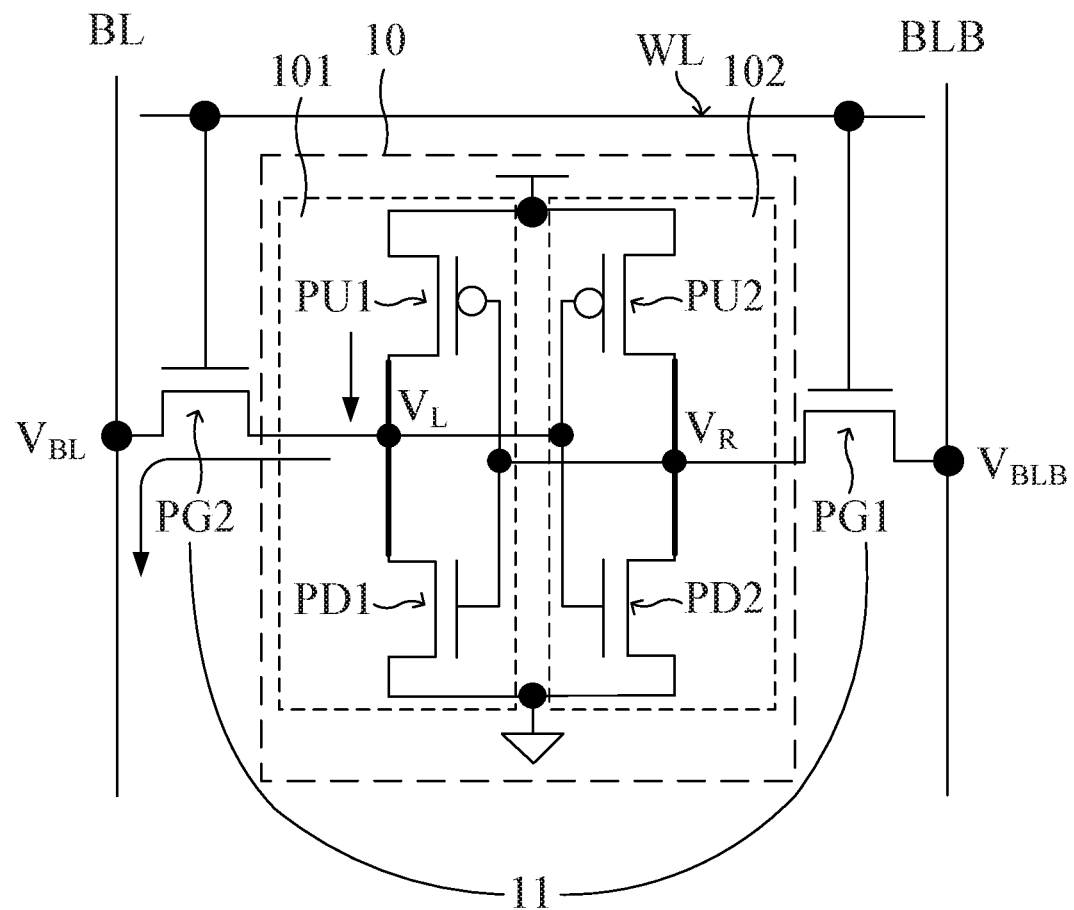
FIG. 1 is block diagram illustrating a conventional single port SRAM cell.
Figure 2A:
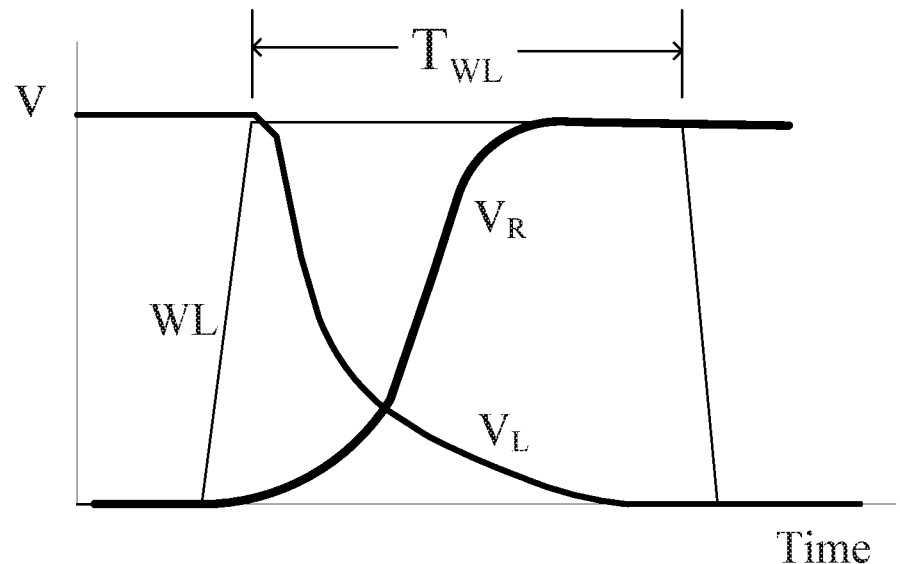
FIG. 2A is a voltage waveform chart of a successful data write operation to the SRAM cell of FIG. 1.
Figure 2B:
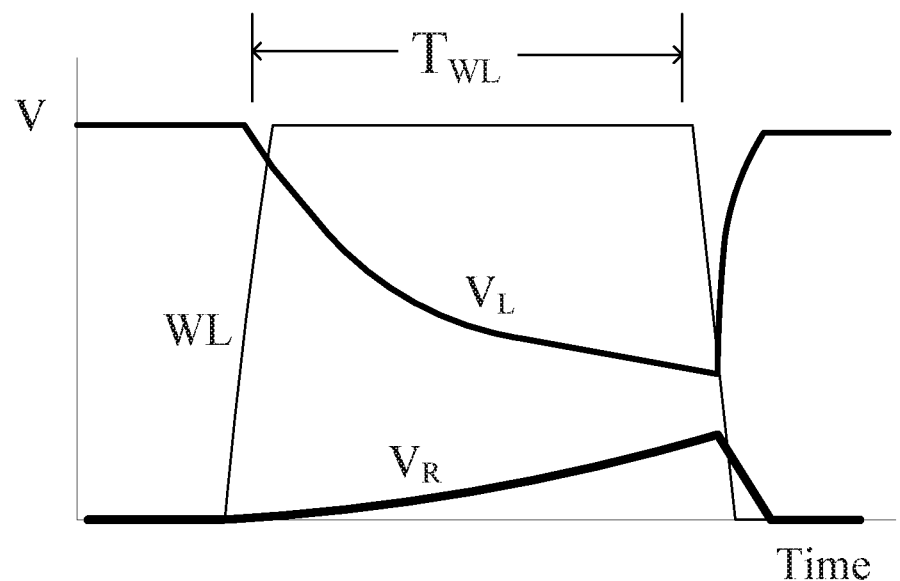
FIG. 2B is a voltage waveform chart of a data write operation failure to the SRAM cell of FIG. 1.
Figure 3:
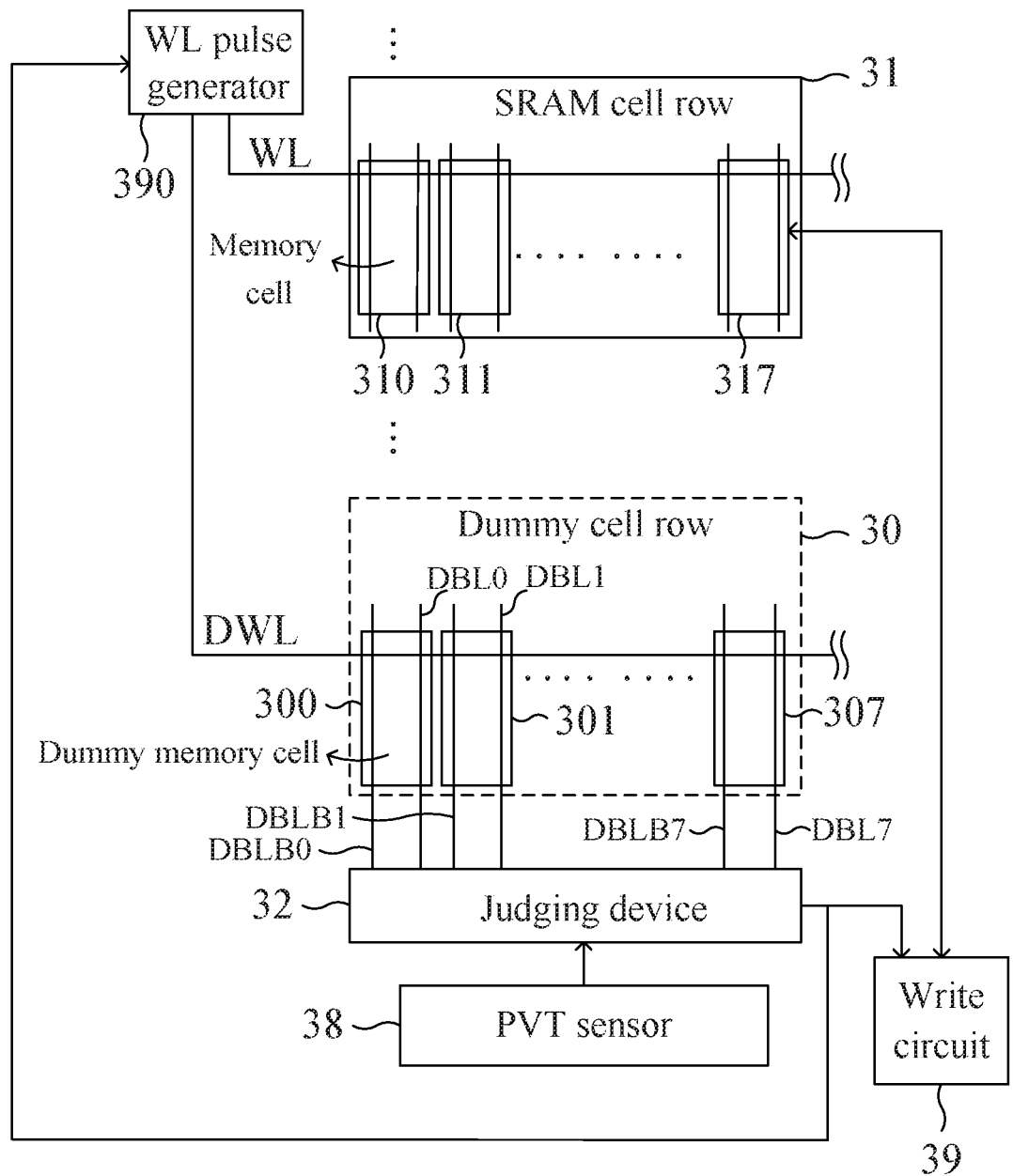
FIG. 3 is a block diagram illustrating a memory write tracking device according to an embodiment of the present invention.

Please refer to FIG. 3, a block diagram illustrating a memory write tracking device according to an embodiment of the present invention. Although the present invention is described with reference to a static random access memory (SRAM), the present invention is widely applicable to different types of memories including physical memory cells. The memory write tracking device includes a dummy cell row 30. In this embodiment, there are eight dummy memory cells 300~307 in the dummy cell row 30, but the number of the dummy memory cells varies with real applications. The dummy cell row 30 may be disposed on the periphery of a SRAM cell row 31. A SRAM cell array (not shown) includes a plurality of the SRAM cell rows 31, but only one SRAM cell row 31 is shown for concise purpose. For example, there are M*N SRAM cells in the SRAM cell array wherein M and N are integers greater than 1. The memory cells of the SRAM cell row 31 and the dummy memory cells of the dummy cell row 30 have the same structure, e.g. the structure of the SRAM cell in FIG. 1. The memory cells 300~307 and 310~317 are formed by the same manufacturing process and the memory cells comply with the same design specification. The dummy cell row 30 is used to simulate and track the response of certain SRAM cell rows 31 in the SRAM cell array. A word-line pulse generator 390 sends first word-line pulses (first control signal) to the dummy word line DWL and second word-line pulses (second control signal) to the word line WL wherein the former control the simulated data write operations to the dummy memory cells 300~307 of the dummy cell row 30 and the later control the data write operations to the memory cells 310~317 of the SRAM cell row 31.

The memory write tracking device further includes a judging device 32 which is electrically connected to the eight dummy memory cells 300~307 of the dummy cell row 30 through corresponding dummy bit lines DBL0~DBL7. The judging device 32 judges whether the simulated write operation to the dummy cell row 30 is successful or not according to voltage changes on the dummy bit lines DBL0~DBL7 and a predetermined threshold or other simulated data. Once the threshold is satisfied, an enabling signal is generated to notify the word-line pulse generator 390 of the end of the write cycle so that the optimum write cycle/period can be determined. In another embodiment, the judging device 32 is electrically connected to the dummy memory cells 300~307 through dummy bit lines DBLB0~DBLB7 instead of the dummy bit lines DBL0~DBL7. The dummy bit lines DBLB0~DBLB7 are respectively complementary to the dummy bit lines DBL0~DBL7. For this case, the judging device 32 judges whether the simulated write operation to the dummy cell row 30 is successful or not according to voltage changes on the dummy bit lines DBLB0~DBLB7. The following description is given based on observing the voltage changes on the dummy bit lines DBL0~DBL7, but the principles can be used for the dummy bit lines DBLB0~DBLB7 without further explanation.

A data write tracking method used with the above-described data write tracking device is described as follows. When a peripheral write circuit 39 is about to performs a data write operation to the SRAM cell row 31, all the dummy memory cells 300~307 of the dummy cell row 30 are reset in advance. For example, the values recorded in the eight dummy memory cells 300~307 are reset as "0". Then, the word-line pulse generator 390 synchronously generates a first word-line pulse (first control signal) to the dummy word line DWL corresponding to the memory cells 300~307 of the dummy cell row 30 and a second word-line pulse (second control signal) to the word line WL corresponding to the memory cells 310~317 of the SRAM cell row 31. The first word-line pulse and the second word-line pulse are substantially the same. The logic high state of the first word-line pulse switches on the dummy memory cells 300~307 and data "1" are written into the dummy memory cells 300~307, while the logic high state of the second word-line pulse switches on the memory cells 310~317 to receive data from corresponding bit lines. The judging device 32 senses the voltage changes on the dummy bit lines DBL0~DBL7 to judge whether data "1" are successfully written into the dummy memory cells 300~307 or not. In this embodiment, the judging device 32 is a counter used for counting the number of the dummy memory cells 300~307 which have been successfully written with the data "1". Once the counted number reaches a threshold number, the judging device 32 sends the enabling signal to end the data write operation. For example, the threshold number is set as five. When the judging device 32 finds that five of the dummy memory cells 300~307 have been successfully written with the data "1" according to the voltage changes on the dummy bit lines DBL0~DBL7, the judging device 32 sends the enabling signal to the word-line pulse generator 390. Thus, the word-line pulse generator 390 changes the second word-line pulse from the logic high state to the logic low state to end the data write operation. Therefore, the pulse width of the second word-line pulse, i.e. the period of the write cycle or the write margin, can be determined by setting the threshold number.

The threshold number may be adjusted when variations exist in the integrated circuit (IC) chip (not shown) having the SRAM cell array. The variations affect the write ability to the memory cells, and the variations or changes of a set of circuit parameters for write ability of the memory cells can be sensed by a variation sensor disposed in the integrated circuit chip. For example, a process, voltage, and temperature (PVT) sensor 38 is disposed in the integrated circuit chip where the SRAM cell array is located. The PVT sensor 38 can sense process variations, voltage variations, temperature variations or parameter changes resulting from the variations. For example, if a process variation which will weaken the voltage pull-down driving so that the data write operation requires a longer write cycle is sensed, the threshold number (setting value of the counter) should be a greater value. In other words, longer simulation is required to successfully write the data "1" into more dummy memory cells of the dummy cell row 30 so that a longer write cycle is determined to ensure successful data write operation to the memory cells 310~317 of the SRAM cell row 31. On the contrary, if a process variation which will strengthen the voltage pull-down driving is sensed, the threshold number may be a smaller value to shorten the write cycle to reduce power consumption on condition that successful/valid data write operation to the memory cells 310~317 of the SRAM cell row 31 is maintained. Other variations such as temperature variation and/or voltage variation may be taken into consideration in a similar manner, and redundant description is not given herein.

According to the present disclosure, the data write tracking method may be performed in a chip packaging and testing procedure to determine the write cycle in advance. Perhaps, the write cycle may be determined at every startup of the system. Further, the write cycle may be determined at regular intervals. Therefore, the SRAM of the present disclosure has adaptive write cycle to achieve a better balance between valid data write operation and economical power consumption.

Figure 4:
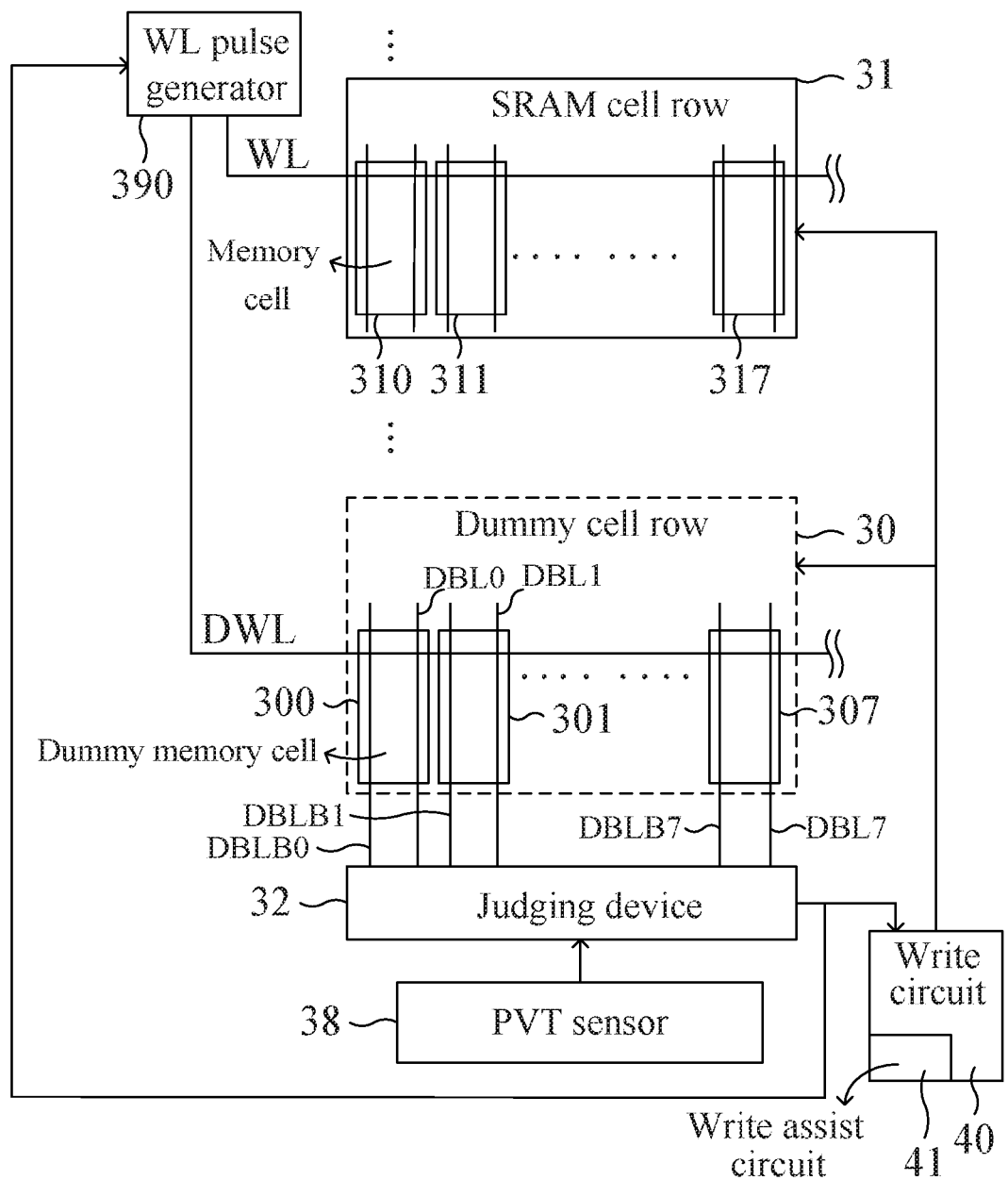
FIG. 4 is a block diagram illustrating a memory write tracking device according to another embodiment of the present invention.

Please refer to FIG. 4, a block diagram illustrating a memory write tracking device according to another embodiment of the present invention. In addition to adjusting the pulse width of the second word-line pulse for the word line WL by the word-line pulse generator 390, a write assist circuit 41 is provided to assist the write circuit 40 to improve the write ability. For example, the write assist circuit 41 with a negative bit-line scheme or a word-line boost scheme can improve the write ability of the write circuit 40 to write to the memory cells 310~317. The write assist circuit 41 can adjust the write assist parameter such as negative bit-line voltage or word-line boost voltage in response to the variation or parameter change sensed by the PVT sensor 38. Therefore, according to the present disclosure, at least three parameters, e.g. the word-line pulse width, the negative bit-line voltage and the word-line boost voltage may be independently or collectively used to adjust and optimize the write ability for the data write operation to the memory cells 310~317 of the SRAM cell row 31, while a better balance between valid data write operation and low power consumption is achieved. In brief, the write ability is enhanced by a more negative bit-line voltage, a higher word-line boost voltage and/or a greater word-line pulse width. However, there is a trade-off between high write ability and low power consumption. The present disclosure provides a method to find the optimum balance between the write ability and the power consumption.

As shown in FIG. 4, the memory write tracking device is used with the SRAM cell array including many SRAM cell rows 31 (only one SRAM cell row 31 is shown in the drawing). The memory write tracking device includes the dummy cell row 30. For example, there are eight dummy memory cells 300~307 in the dummy cell row 30. The dummy memory cells 300~307 of the dummy cell row 30 and the memory cells 310~317 of the SRAM cell row 31 have the same structure. All the memory cells are formed by the same manufacturing process, and they comply with the same design specification. The dummy cell row 30 is used to simulate and track the response of the SRAM cell rows 31 in the SRAM cell array. The word-line pulse generator 390 sends first word-line pulses (first control signal) to the dummy word line DWL and second word-line pulses (second control signal) to the word line WL wherein the former control the simulated data write operations to the dummy memory cells 300~307 of the dummy cell row 30 and the later control the data write operations to the memory cells 310~317 of the SRAM cell row 31. The judging device 32 is electrically connected to the eight dummy memory cells 300~307 of the dummy cell row 30 through corresponding dummy bit lines DBL0~DBL7. The judging device 32 counts the number of the dummy memory cells which have been successfully written with the data "1" during a specified write cycle (corresponding to a specified first word-line pulse width). If the counted number is greater than or equal to the threshold number, the judging device 32 sends an adjusting signal to assist the write circuit 40 to adjust the write assist parameter(s). The write circuit 40 includes the write assist circuit 41. For example, the write assist circuit 41 with the negative bit-line scheme or the word-line boost scheme can assist the write circuit 40 to improve the write ability to write to the dummy cell row 30 and the SRAM cell row 31.

A data write tracking method used with the above-described data write tracking device is described as follows. When a data write operation is about to be performed to one SRAM cell row 31 of the SRAM cell array, all the dummy memory cells 300~307 of the dummy cell row 30 are reset in advance. For example, the values recorded in the eight dummy memory cells 300~307 are reset as "0", and the write assist circuit 41 is disabled. Then, the word-line pulse generator 390 synchronously generates the first word-line pulse (first control signal) to the dummy word line DWL corresponding to the memory cells 300~307 of the dummy cell row 30 and the second word-line pulse (second control signal) to the word line WL corresponding to the memory cells 310~317 of the SRAM cell row 30. The first word-line pulse and the second word-line pulse are substantially the same. The logic high state of the first word-line pulse switches on the dummy memory cells 300~307 and data "1" are written into the dummy memory cells 300~307, while the logic high state of the second word-line pulse switches on the memory cells 310~317 to receive data from corresponding bit lines. During the specified period, the judging device 32 counts the number of the dummy memory cells which have been successfully written with the data "1". Then, the counted number is compared with the threshold number. If the counted number is less than the threshold number, it means that the write ability is insufficient to successfully write data into the SRAM cell row 31 within the specified write cycle. The write assist circuit 41 is enabled to enhance the write ability of the write circuit 40 to write to the memory cells. For example, the negative bit-line voltage and/or the word-line boost voltage (i.e. write assist parameters) are gradually increased from the lowest. The simulated data write operation and the comparison between the counted number and the threshold number are made after every adjusting step. Once the counted number is equal to or greater than the threshold number, the judging device 32 sends an adjusting signal to the write circuit 40 to stop the adjusting step. The final write assist parameters are the optimum write assist parameters for the data write operation to the SRAM cell row 31. The balance between valid data write operation and low power consumption is efficiently achieved.

The threshold number may be adjusted when variations affecting the write ability of the memory cells exist in the integrated circuit chip. The variations or the changes of the set of circuit parameters can be sensed by a variation sensor, e.g. the PVT sensor 38 disposed in the integrated circuit chip where the SRAM cell array is located. For example, if a process variation which will weaken the voltage pull-down driving so that the data write operation requires a longer write cycle is sensed, the threshold number should be a greater value. In other words, longer simulation is required to successfully write the data "1" into more dummy memory cells of the dummy cell row 30 so that a longer write cycle is determined to ensure successful data write operation to the memory cells 310~317 of the SRAM cell row 31. On the contrary, if a process variation which will strengthen the voltage pull-down driving is sensed, the threshold number may be a smaller value to shorten the write cycle to reduce power consumption on condition that successful/valid data write operation to the memory cells 310~317 of the SRAM cell row 31 is maintained. Other variations such as temperature variation and/or voltage variation may be taken into consideration in a similar manner, and redundant description is not given herein.

According to the present disclosure, the data write tracking method may be performed in a chip packaging and testing procedure to determine the write cycle in advance. Perhaps, the write cycle may be determined at every startup of the system. Further, the write cycle may be determined at regular intervals. Therefore, the SRAM of the present disclosure has adaptive write cycle to achieve a better balance between valid data write operation and economical power consumption.

Figure 5A:
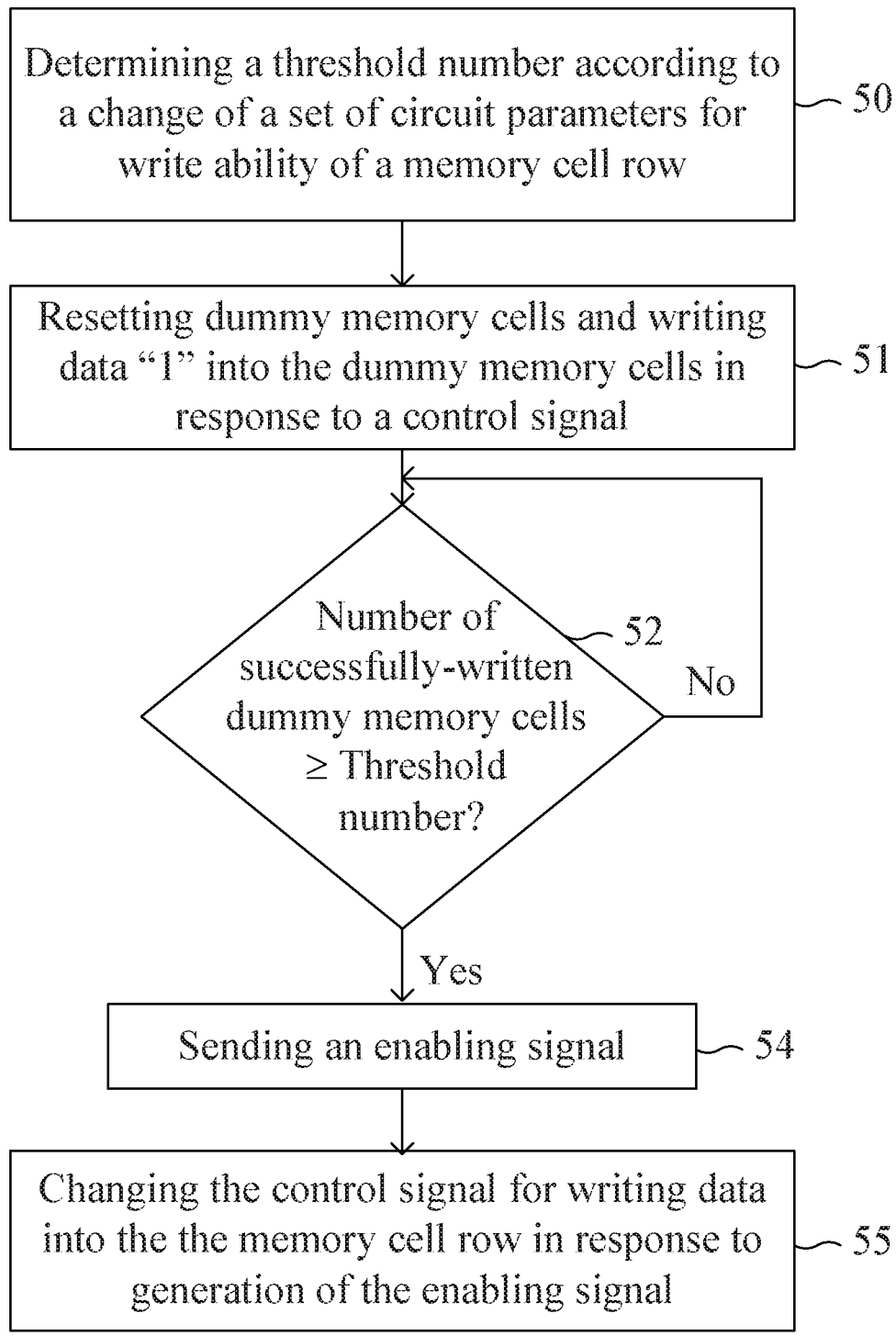
FIG. 5A is a flow chart illustrating a memory write tracking method according to an embodiment of the present invention.

Please refer to FIG. 5A, a flow chart illustrating a memory write tracking method according to an embodiment of the present invention. The memory write tracking method is applied to the data write operation to the memory cells of the memory cell row 31. At first, a threshold number is determined according to a change (variation) of a set of circuit parameters for write ability of the memory cells of the memory cell row 31 (step 50). The dummy memory cells of the dummy cell row 30 are reset as "0" and then written with data "1" in response to a first logic state of a control signal (step 51). The dummy cell row 30 includes N dummy memory cells. The judging device 32 judges whether a threshold number of the dummy memory cells have been successfully written with the data "1" or not (step 52). If the number is less than the threshold number, the writing step continues until the number is greater than or equal to the threshold number. Then, an enabling signal is sent (step 54). The control signal is changed from the first logic state to a second logic state in response to the generation of the enabling signal so as to determine the write cycle for the data write operation to the memory cells of the memory cell row (step 55). For example, the control signal is a word-line pulse, and the first logic state and the second logic state are the logic high state and the logic low state, respectively. The method considers both valid data write operation and low power consumption.

Figure 5B:
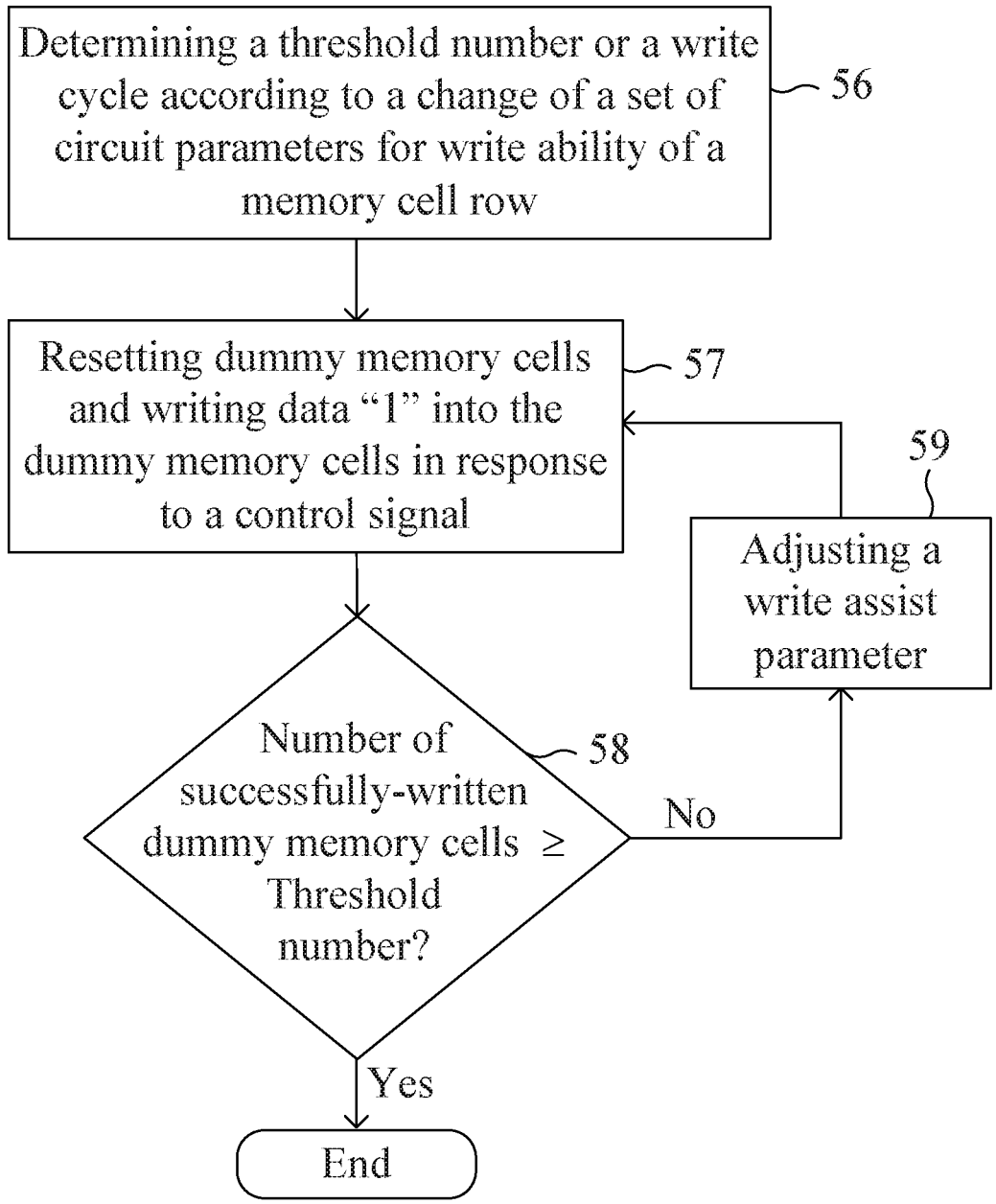
FIG. 5B is a flow chart illustrating a memory write tracking method according to another embodiment of the present invention.

Please refer to FIG. 5B, a flow chart illustrating a memory write tracking method according to another embodiment of the present invention. The memory write tracking method is applied to the data write operation to the memory cells of at least one memory cell row 31. At first, a threshold number or a write cycle is determined according to a change (variation) of a set of circuit parameters for write ability of the memory cells of the memory cell row 31 (step 56). The dummy memory cells of the dummy cell row 30 are reset as "0" and then written with data "1" in response to a control signal (step 57). The dummy cell row 30 includes N dummy memory cells. The judging device 32 judges whether a threshold number of the dummy memory cells have been successfully written with the data "1" within the write cycle (step 58). If the number is less than the threshold number, a write assist parameter is adjusted (step 59). Then, the method goes back to step 57 to repeat the resetting and writing step. Once the number is greater than or equal to the threshold number, the write assist parameter is determined and fixed. For example, the control signal is a word-line pulse. The write assist parameter may include, but is not limited to, a negative bit-line voltage or a word-line boost voltage. The method considers both valid data write operation and low power consumption.

Figure 6:
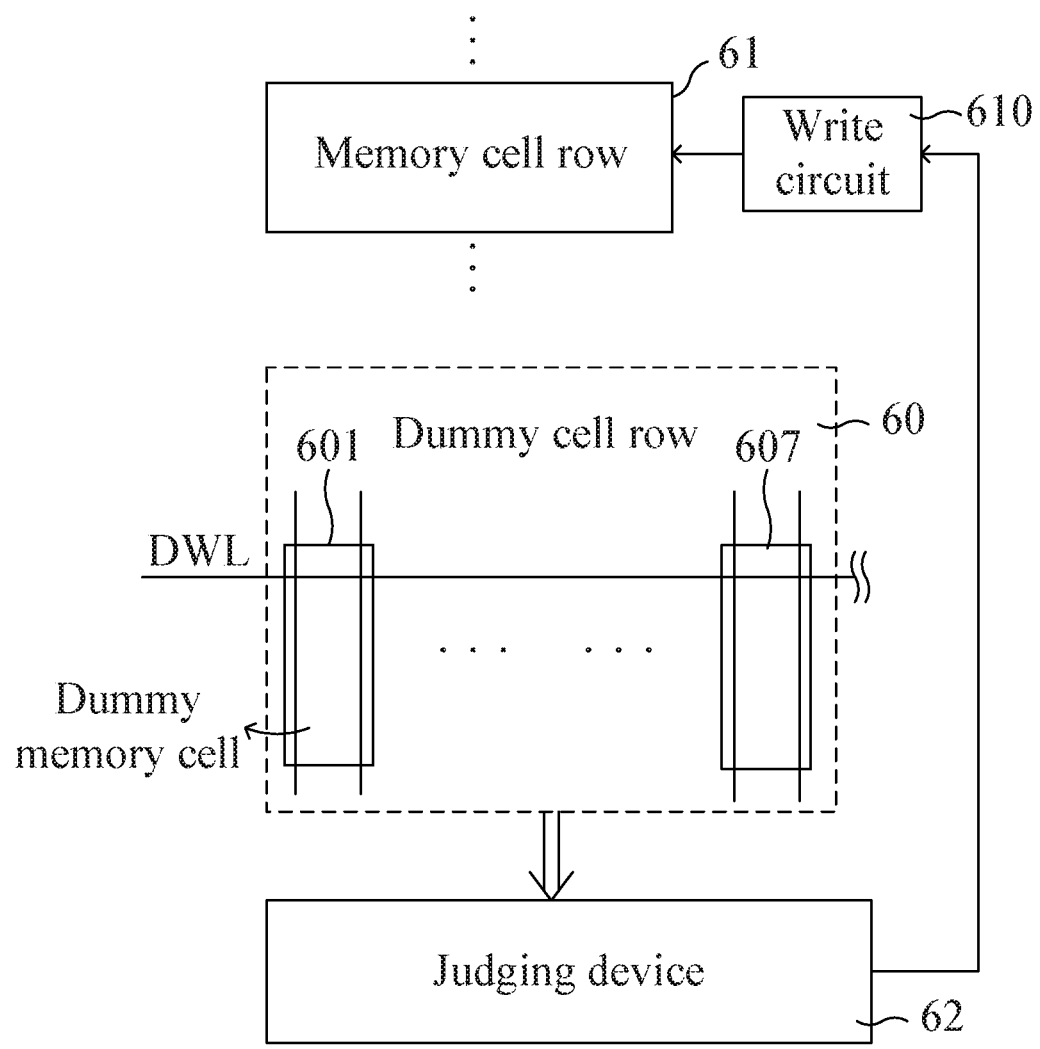
FIG. 6 is a block diagram illustrating a memory write tracking device according to a further embodiment of the present invention.

Please refer to FIG. 6, a block diagram illustrating a memory write tracking device according to a further embodiment of the present invention. The memory write tracking device is used with at least one memory cell row 61. The memory write tracking device includes a dummy cell row 60 including N dummy memory cells wherein N is an integer greater than 1. For example, N is 7 in FIG. 6. The write operation to the dummy memory cells 601~607 are controlled by a dummy word-line pulse (control signal) on a dummy word line (DWL). In particular, the dummy memory cells 601~607 are provided with different write abilities. Data are written into all of the dummy memory cells 601~607 during a specified write cycle (corresponding to a specified word-line pulse width). Then, the judging device 62 counts the number of the dummy memory cells which have been successfully written with the data. The write ability for the data write operation is adjusted according to the counted number. If a ratio of the successfully-written dummy memory cells to all dummy memory cells is small, write ability for the data write operation should be raised. The judging device 62 may be implemented by a digital logic circuit such as a counter to count the number of the successfully-written dummy memory cells within the specified write cycle. The write assist parameters may be, but are not limited to, the negative bit-line voltage and/or the word-line boost voltage. The dummy memory cells 601~607 correspond to different write abilities may cover variations (e.g. process variation or temperature variation) in the memory chip. To provide the dummy memory cells 601~607 with different write abilities, metal-oxide-semiconductor (MOS) transistors in the dummy memory cells 601~607 have different sizes or doping concentrations.

Figure 7A:
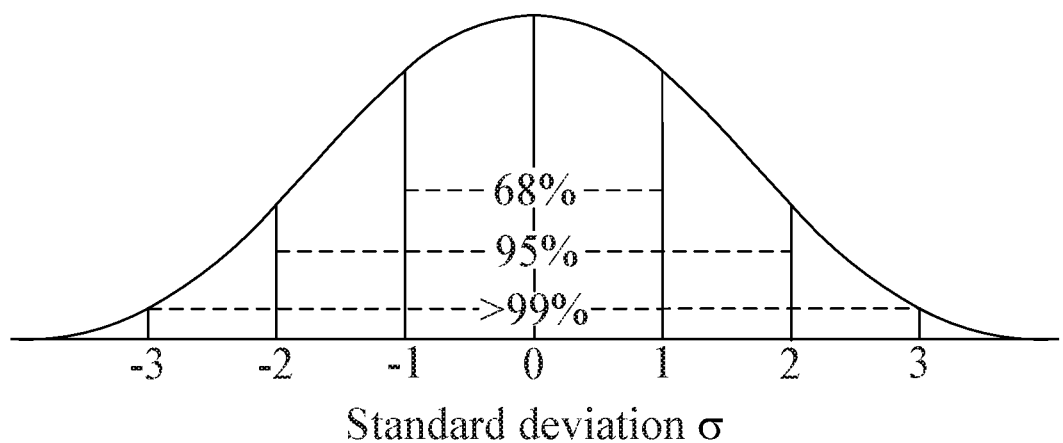
FIG. 7A is a statistical distribution plot of write cycles of the memory cells in FIG. 6.
Figure 7B:
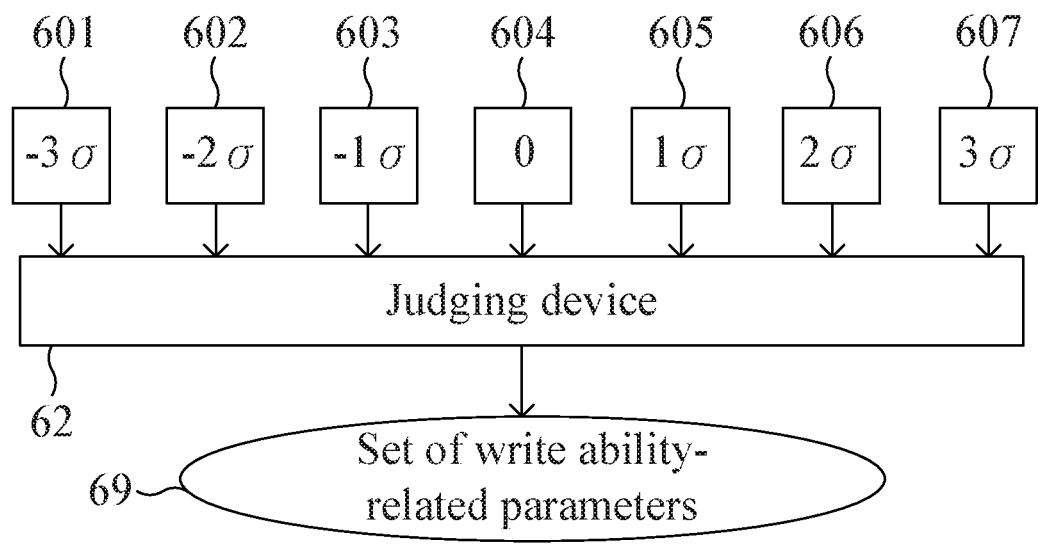
FIG. 7B is a schematic diagram showing the design of the dummy cell row according to the statistical distribution plot of FIG. 7A.

To realize variations/distribution of the write abilities to the memory cells resulting from process variations and effectively simulate every memory cell row 61 in the integrated chip, a statistical method may be used to determine the write abilities to the dummy memory cells according to the distribution of the write abilities to the memory cells of the memory cell rows 61. At first, for each of the memory cell rows 61, a write test is performed to obtain a corresponding write cycle (write ability-related parameter) on condition that all the memory cells in the memory cell row 61 have been successfully written with specified data. FIG. 7A shows the statistical distribution plot of the write cycles corresponding to fully-successful write operation. The x-axis of the distribution plot is represented on a basis of standard deviation a, and the y-axis indicates the corresponding sample number. In an embodiment, the seven dummy memory cells 601~607 are provided with write cycles of $-3\sigma$, $-2\sigma$, $-1\sigma$, 0, $1\sigma$, $2\sigma$ and $3\sigma$, respectively (FIG. 7B). Such design covers more than 99% of the memory cell rows 61 (population with variations in statistics) in the integrated circuit chip. Nevertheless, other representative write cycles may be selected to design the dummy memory cells. The dummy memory cells with specified write cycles may be formed by adapting sizes or other parameters of the dummy memory cells. The simulation is much effective since the dummy memory cells can properly represent the memory cell rows 61 with variations. The judging device 62, implemented by a digital logic circuit such as decoder, can adjust a set of the write ability-related parameters 69 for the data write operation to the memory cell rows 61 according to the counted number to achieve balance between low power consumption and valid data write operation. The write ability-related parameters 69 include, but are not limited to, the negative bit-line voltage, the word-line boost voltage and the word-line pulse width.

The variations may be observed by measuring and analyzing other parameters affecting the write ability to the memory cells, e.g. drain saturation currents Idsat or threshold voltages Vth of the memory cells of the memory cell rows 61. Under this condition, the standard deviation σ is based on the drain saturation current or the threshold voltage instead of the write cycle in the above-described embodiment. Thus, the seven dummy memory cells 601~607 may be designed to have the drain saturation currents or the threshold voltages of $-3\sigma$, $-2\sigma$, $-1\sigma$, 0, $1\sigma$, $2\sigma$ and $3\sigma$, respectively. The dummy memory cells with specified write ability may be formed by adapting the sizes or doping concentrations of the transistors of the dummy memory cells.

Figure 8:
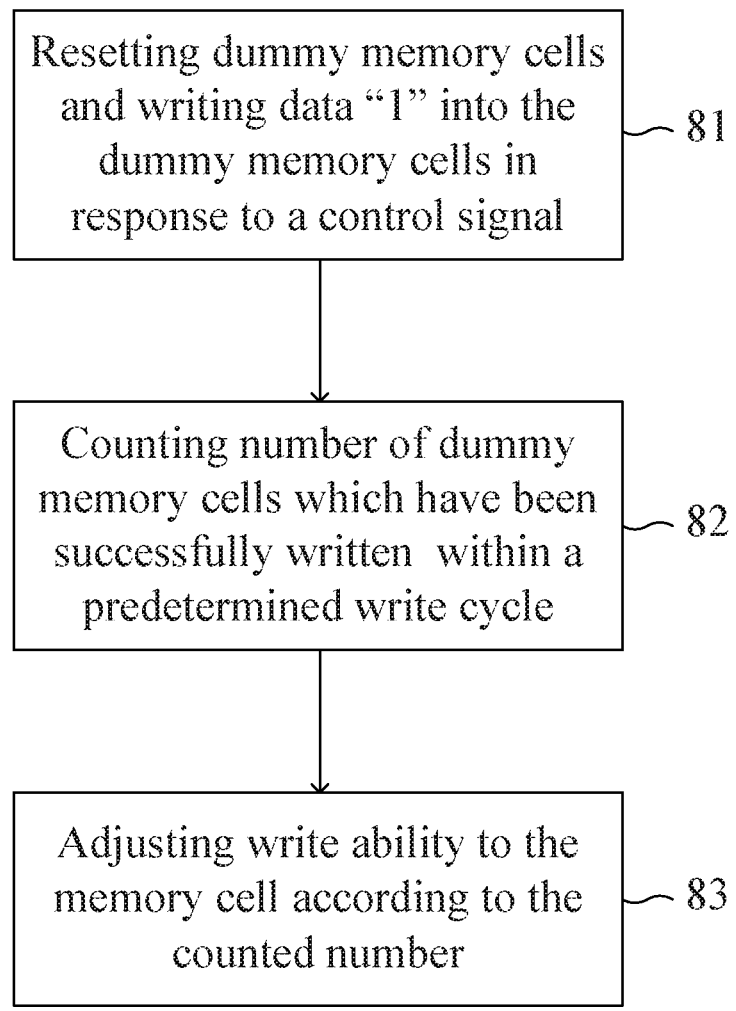
FIG. 8 is a flow chart illustrating a memory write tracking method according to a further embodiment of the present invention.

Please refer to FIG. 8, a flow chart illustrating a memory write tracking method according to a further embodiment of the present invention. The memory write tracking method is applied to the data write operation to the memory cells of at least one memory cell row 61 of FIG. 6. At first, the dummy memory cells of the dummy cell row 60 are reset as "0" and then written with data "1" in response to a control signal, e.g. a word-line pulse (step 81). The dummy cell row 60 includes N dummy memory cells requiring different write abilities. More specially, each write ability is different from every other write ability. Then, the number of the dummy memory cells which has been successfully written with the data "1" within a predetermined write cycle is counted (step 82). Write ability for the data write operation to the memory cell row 61 is adjusted according to the counted number (step 83). The adjusting step in step 83 may be performed by adjusting parameters such as negative bit-line voltage, word-line boost voltage and/or word-line pulse width. The method considers both valid data write operation and low power consumption.

It is to be noted that more than one dummy cell row may be provided on the periphery of the memory cell array. The dummy cell rows may be disposed at different areas to cover possible variations affecting the write abilities to the memory cells. Thus, simulation precision of tracking the data write operation is significantly enhanced to obtain the optimum operation condition for writing data into memory cell array/rows.

In conclusion, the memory write tracking devices and the memory write tracking methods can be applied to various kinds of memories. The optimum write conditions/parameters or the optimum write cycle for successfully writing data into memories can be determined with lowest power consumption. Therefore, the present memory write tracking devices and methods are competitive with the prior arts.

While the disclosure has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A memory write tracking device applied to a data write operation to at least a memory cell row, the memory write tracking device comprising:
   a dummy cell row comprising a plurality of dummy memory cells, data being written into the dummy memory cells in response to a first control signal on a dummy word line;
   a variation sensor for sensing a set of circuit parameters for write ability of the memory cell row;
   a judging device electrically connected to the dummy memory cells and the variation sensor, for determining a threshold number according to a change of the set of circuit parameters, and sending an enabling signal when the threshold number of the dummy memory cells have been successfully written with the data; and
   a word-line pulse generator electrically connected to the judging device, the memory cell row and the dummy word line, for generating the first control signal to the dummy word line, generating a second control signal to control the data write operation to the memory cell row, and determining a write cycle of the second control signal in response to the enabling signal.

2. The memory write tracking device according to claim 1, wherein the judging device is a counter for counting the number of the dummy memory cells which have been successfully written with the data, and sending the enabling signal to the word-line pulse generator.

3. A memory write tracking device applied to a data write operation to at least a memory cell row, the memory write tracking device comprising:
   a dummy cell row comprising a plurality of dummy memory cells, data being written into the dummy memory cells in response to a control signal on a dummy word line;
   a judging device electrically connected to the dummy memory cells for sending an adjusting signal when a threshold number of the dummy memory cells have been successfully written with the data within a predetermined write cycle; and
   a write circuit electrically connected to the memory cell row and the judging device, for adjusting a write ability-related parameter until the adjusting device sends the adjusting signal,
   the write circuit comprising a write assist circuit for adjusting a negative bit-line voltage or a word-line boost voltage in connection with write ability.

4. The memory write tracking device according to claim 3, further comprising a variation sensor electrically connected to the judging device, for sensing a set of circuit parameters for write ability of the memory cell row,
   the judging device determining the threshold number according to a change of the set of circuit parameters.

5. The memory write tracking device according to claim 4, wherein the judging device is a counter for counting the number of the dummy memory cells which have been successfully written with the data, and sending the adjusting signal to the write circuit.

6. A memory write tracking device applied to a data write operation to at least a memory cell row, the memory write tracking device comprising:
   a dummy cell row comprising a plurality of dummy memory cells, data being written into the dummy memory cells in response to a control signal on a dummy word line, each of the dummy memory cells corresponding to different write ability; and
   a judging device electrically connected to the dummy memory cells and the memory cell row, for counting number of the dummy memory cells which have been successfully written with the data within a predetermined write cycle and adjusting write ability to the memory cell row according to the counted number.

7. The memory write tracking device according to claim 6, wherein the dummy memory cells have metal-oxide-semiconductor transistors with different sizes or doping concentrations so that each of the dummy memory cells corresponds to different write ability.

8. The memory write tracking device according to claim 7, wherein the judging device adjusts the write ability to the memory cell row by adjusting a write assist parameter.

9. A memory write tracking method applied to a data write operation to at least a memory cell row, the memory write tracking method comprising steps of:
   providing a dummy cell row comprising a plurality of dummy memory cells;
   writing data into the dummy memory cells in response to a control signal;
   sending an enabling signal when a threshold number of the dummy memory cells have been successfully written with the data; and
   changing the control signal for writing data into the memory cell row in response to generation of the enabling signal or adjusting a write ability-related parameter if the enabling signal is not generated.

10. A memory write tracking method applied to a data write operation to at least a memory cell row, the memory write tracking method comprising steps of:
    providing a dummy cell row comprising a plurality of dummy memory cells, each of the dummy memory cells corresponding to different write ability;
    writing data into the dummy memory cells in response to a control signal;
    counting number of the dummy memory cells which have been successfully written with the data within a predetermined write cycle; and
    adjusting write ability to the memory cell row according to the counted number,
    the dummy memory cells having metal-oxide-semiconductor transistors with different sizes or doping concentrations so that each of the dummy memory cells corresponds to different write ability.

* * * * *